United States Patent
Ho et al.

(10) Patent No.: US 6,341,970 B1
(45) Date of Patent: Jan. 29, 2002

(54) MODULARIZED SOCKET FOR INTEGRATED CIRCUIT

(75) Inventors: Han Shin Ho, Hsinchu Hsien; Wei Hai Lai; Chien Shuan Kuo, both of Hsinchu; Deng Tswen Shieh, Kaohsiung; Ming Hsien Wang, Taipei; Chin Ting Whung, Shin Chu, all of (TW)

(73) Assignee: UREX Precision, Inc. (TW)

( * ) Notice: Subject to any disclaimer, the term of this patent is extended or adjusted under 35 U.S.C. 154(b) by 0 days.

(21) Appl. No.: 09/454,550

(22) Filed: Dec. 7, 1999

(30) Foreign Application Priority Data

Jul. 15, 1999 (TW) .......................................... 88112028

(51) Int. Cl.[7] .............................................. H01R 11/22
(52) U.S. Cl. ......................................... 439/266; 439/66
(58) Field of Search ............................ 439/66–73, 330, 439/331, 525, 526, 266, 269

(56) References Cited

U.S. PATENT DOCUMENTS

| 5,397,245 | A | * | 3/1995 | Roebuck et al. ............ 434/331 |
| 5,409,392 | A | * | 4/1995 | Marks et al. ................ 439/266 |
| 5,499,929 | A | * | 3/1996 | Miyazawa ................... 439/331 |
| 5,880,590 | A | * | 3/1999 | Desai et al. ................... 439/66 |
| 5,908,324 | A | * | 6/1999 | Ohshima et al. ............. 439/266 |
| 6,033,235 | A | * | 3/2000 | Ikeya .......................... 439/331 |
| 6,062,873 | A | * | 5/2000 | Kato ............................. 439/66 |
| 6,152,744 | A | * | 11/2000 | Maeda ........................ 439/331 |

* cited by examiner

*Primary Examiner*—Hien Vu
(74) *Attorney, Agent, or Firm*—Powell, Goldstein, Frazer & Murphy LLP

(57) ABSTRACT

A replaceable and modularized integrated circuit's socket. The modularized socket comprises: (1) a base unit, it further consists of a base, contact pins and an elastomer. The contact pin will provide the electrical connection of the other elements, the elastomer provides the compactness of the assembly. (2) an interposer, there are positioning holes, contact pads and conducting wires in this interposer. (3) an adapter unit, the unit is capable of positioning the integrated circuit device and includes a depressor to suppress or release the integrated circuit. (4) a cover unit, the cover unit is coupled to said adapter and is capable of moving up and down vertically and drive the depressor to press or release the integrated circuit device. The modularized socket can fit the integrated circuit devices with different sizes and pin assignment, also much easier to repair.

8 Claims, 9 Drawing Sheets

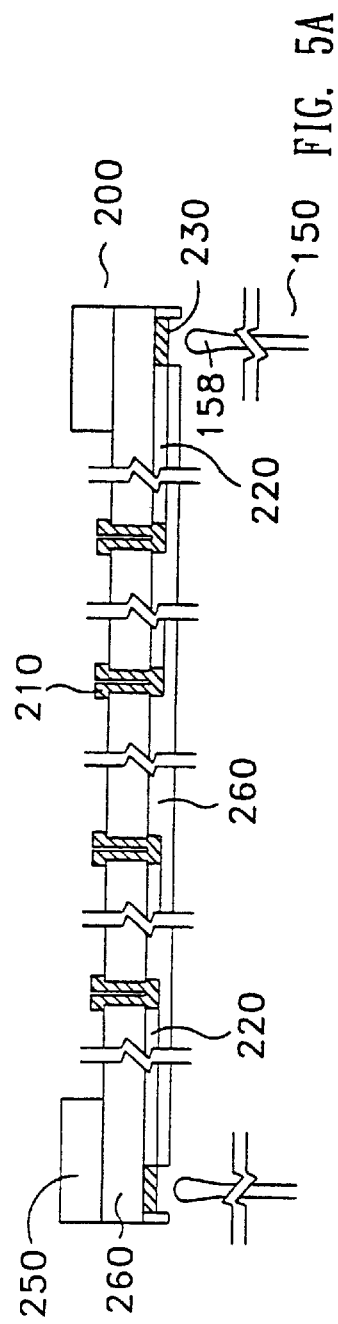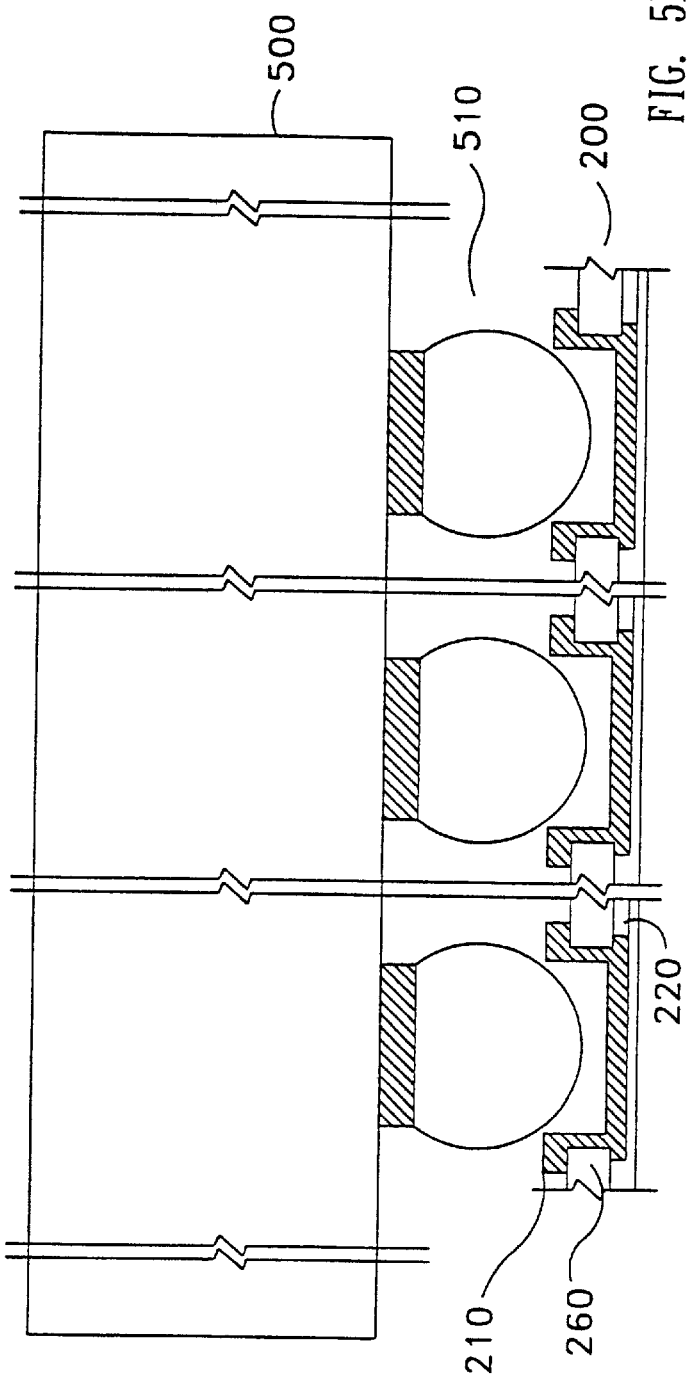
FIG. 5A
FIG. 5B

MODULARIZED SOCKET FOR INTEGRATED CIRCUIT

FIELD OF THE INVENTION

The present invention relates to a socket of integrated circuits, and particularly to a socket of integrated circuits which is modularized and replaceable.

BACKGROUND OF THE INVENTION

With the rapid development of semiconductor industry these years, when the density of integrated circuits (ICs) becoming bigger and bigger, the line width decreased to sub-micron range, even deep sub-micron. Nevertheless, the lifetime of the integrated products becoming shorter. Since the variable requirement with ICs also increased, there are products with different functions, sizes, and pin assignment.

In the processing steps of semiconductor devices, there are many testing steps after IC devices completed to ensure the functionality and quality of the IC devices. For example, the testing steps of an IC chip may include the testing of lead frame, the power consumption, the basic logic and output voltage level in a "burn in" test. The basic hardware structure of these testing is to use a socket or a connector to locate the IC chip.

Conventional connectors of IC chips such as logic circuits for central processing unit (CPU) or memory circuits are all with specific usage and pin assignment, therefore the sockets they use are always welding on the printing circuit board (PCB) and are not replaceable. Furthermore, the conventional sockets for locating the IC chip are soldered on the PCB and are designed for specific kind of IC chip. The clamping structure of the socket is used to fix the IC device and conduct it for testing. That is, the testing IC socket of this kind is not replaceable.

However, since the life cycle of the IC devices are very short, it is possible that the IC sockets and the connected PCB are useless after the IC products are not produced any more. Moreover, a new socket is redesigned for another IC device. Further, since the conventional testing IC sockets are welding on the PCB, it is not easy to repair the sockets in case one of the sockets is damaged. One way to repair the damaging socket is to release the welding parts of the socket and pull out of the PCB, then re-soldering another socket on the board for the subsequent testing. Nevertheless, the repair work of this kind is not economical and wasting manpower.

Briefly, the conventional IC socket is fastened on the testing printed circuit board and is not easy to replace when the socket is damaged. Besides, a conventional socket can only fit a specific pitch number of IC device. Therefore, there is a need of a new IC socket in the testing field of the IC device.

SUMMARY OF THE INVENTION

The main object of the present invention is a modularized IC socket used for testing, part of the modules can be replaced to suit for different types of IC devices.

Another object of the present invention is to use a modularized IC socket to save the manpower and the cost.

A further object of the present invention is to use a modularized IC socket to fit the future need of fine pitch IC device.

In the first preferred embodiment of the present invention, the modularized IC socket comprised:

(1) A base unit: It further includes a base, contact pins, and an elastomer. There are recessed portions in the base to locate the elastomer and contact pins. One end of the contact pin is a straight end to stretch out of the lower portion of the base and solder on the printed circuit board, another end of the contact pin is a portion with a U shape cantilever to stretch out of the upper portion of the base and contact with other element. The elastomer has elasticity and compressibility to provide a good electrical contact.

(2) An interposer: The interposer is the interface of the IC chip and the base unit. It further includes contact pads, accepters and conducting wires on the conducting surface. The accepter is connected to the solder balls of IC chip, through the joined conducting wires with the contact pad and the connected contact pin to achieve the function of electrical connection. There are positioning holes in the interposer to align with the underneath base unit.

(3) An adapter unit: The adapter unit is placed on the base unit and the interposer. It further includes an adapter base, a depressor, and a shaft. The adapter unit provides the positioning function of the IC chip, and the depressor is rotated about the shaft to suppress or release the IC chip.

(4) A cover unit: The unit is located over the base unit, the interposer, and the adapter unit. It further includes a cover and springs. The cover unit will move up and down vertically, wherein when the cover unit press downward, the coupling depressor of the adapter unit will rotate to free the IC chip, though when the cover unit pull upward, the depressor is suppressed on the IC chip to keep a good electrical contact.

The modularized IC socket of the first preferred embodiment of the present invention is suitable for an array type IC chip package. When the pin assignment of the IC chip are changed, the interposer can be redesigned to fit the different IC chip, or change the adapter unit and the cover unit at most. Nevertheless, the bottom base unit will keep on the PCB.

The second preferred embodiment of the present invention is summaries as follows:

(1) The base unit: The base unit includes a base and contact pins as the first embodiment. One end of the contact pin is welding on the PCB and another end of the contact pin is electrically connected with the upper device.

(2) The interposer: The interposer is an interface of the lower base unit and the upper adapter unit; there are contact pads and conducting wires thereon to provide the electrical connection.

(3) The adapter unit: The unit is located over the base unit and the interposer and it further includes an adapter and contact pins. Contact pins is recessed in the adapter with one end electrically connect to the underneath contact pads of the interposer, and another end with an elastic U shape cantilever and a protrusion to electrically connect to the IC device.

(4) The cover unit: The unit is placed on the base unit, the interposer, and the adapter unit and it further includes a cover and springs. The cover unit can move up and down vertically to suppress or release the IC chip. There is a inclined plane in the cover unit to couple with one end of the contact pin in the adapter unit, the movement of the cover unit will cause the contact pin become a stretched position or recover to a normal position.

The modularized IC socket of the second embodiment of the present invention is suitable to a lead frame type IC chip package. Furthermore, the replaceable parts of the socket fit the requirement of different sizes or pin assignment of the IC chip.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIGS. 5A~5B are cross-sections of an array package IC contact with interposer according to the first embodiment of the present invention;

DETAILED DESCRIPTION OF THE PREFERRED EMBODIMENT

The present invention discloses a modularized integrated circuit (IC) testing socket. Due to the difficulties of replacement and the high cost of the conventional IC testing socket, the IC socket of the present invention is suitable for different types, different pitches, and the fine pitch IC chips, also is easy to replace and repair. There are two preferred embodiments to describe the present invention in detail. However, it is noted that the depicted drawings of the present invention with the same label are denoted as the same elements for the sake of convenience.

The First Preferred Embodiment

Figure 1:
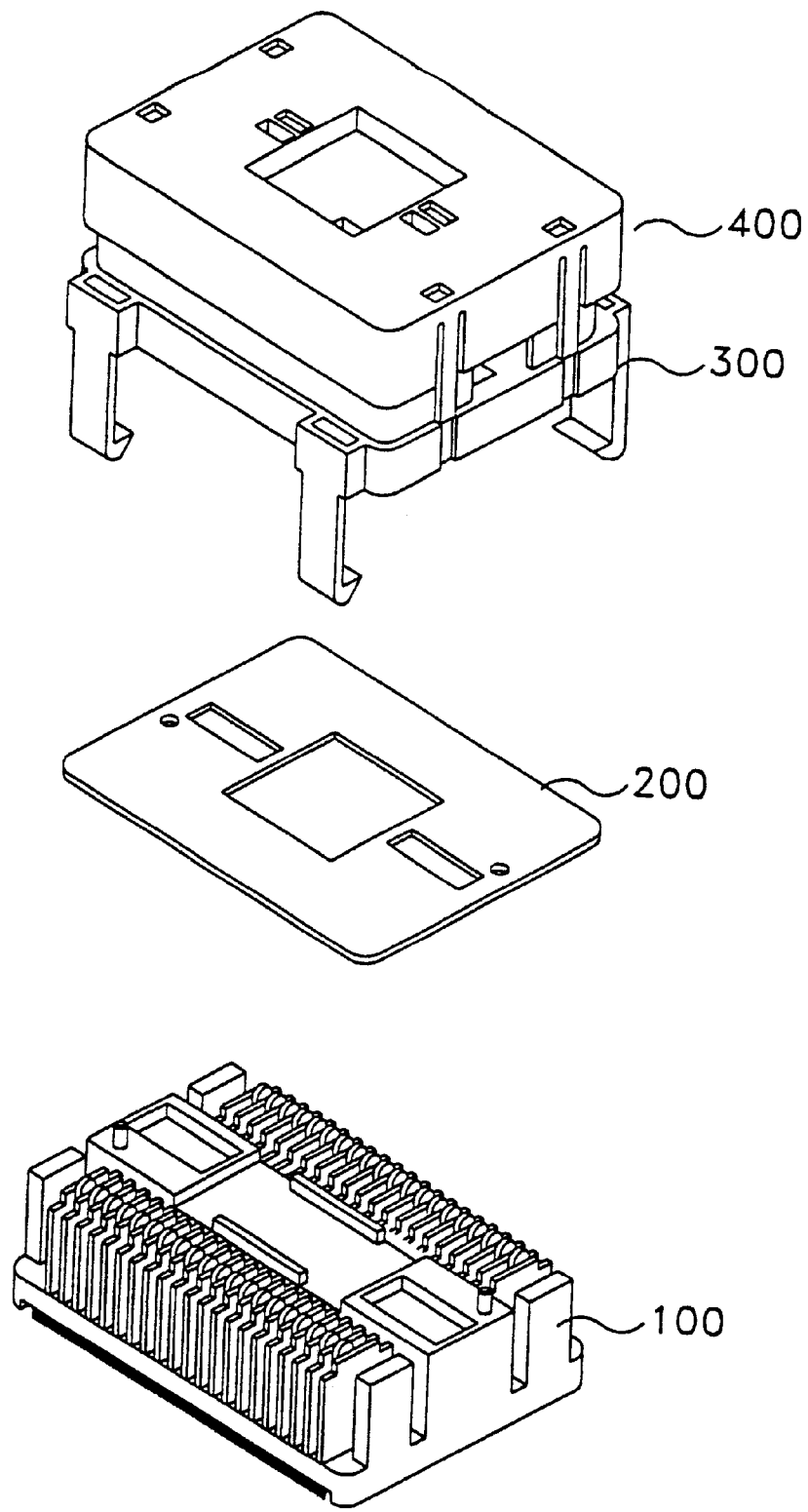
FIG. 1 is an exploded perspective drawing of a modularized IC socket according to the present invention.

Referring to FIG. 1, this figure shows an exploded perspective drawing of a modularized IC socket. The IC socket module in this figure is the base unit 100, the interposer 200, the adapter unit 300, and the cover unit 400. The base unit 100 is a housing with contact pins to fix inside this housing for welding on a printing circuit board (PCB). Next, the interposer 200 is a plastic material with contact pads and conducting wires thereon. Then, the adapter unit 300 is a device with four clasps to fasten the whole modularized socket. Finally, the cover unit 400 is used for suppressing or releasing the IC chip.

Figure 2:
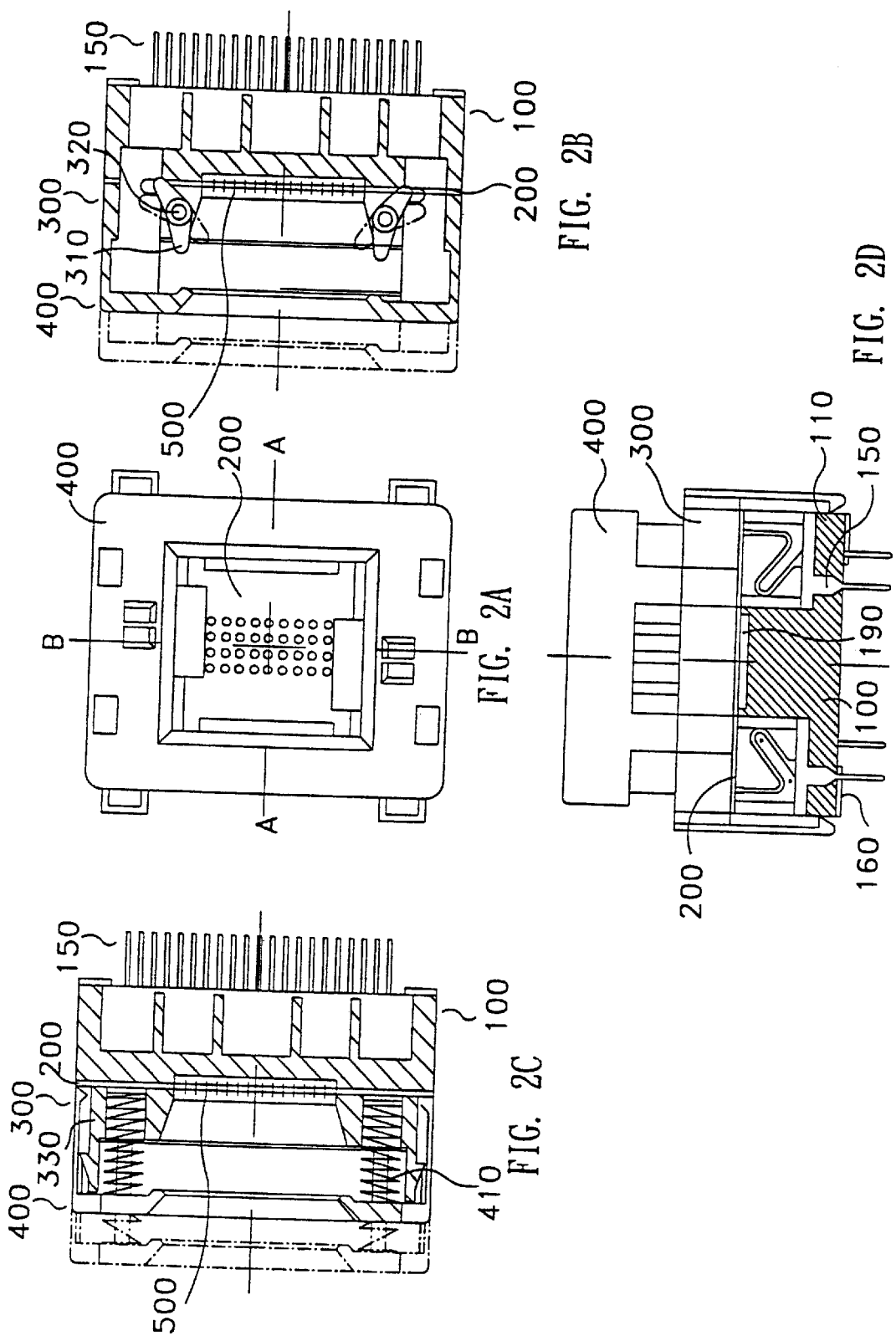
FIGS. 2A~2D are three views of a modularized IC socket according to the first embodiment of the present invention.

Now referring to FIGS. 2A~2D, the three different views are shown according to the first embodiment of the present invention. The FIG. 2A is a vertical view of the modularized socket, and the FIG. 2D is a cross-sectional view at line AA in FIG. 2A, the FIG. 2B and 2C are cross-sectional views at line BB in FIG. 2A. For better understanding of the drawings, the first referred embodiment is described as follows:

(1) The base unit 100: In FIG. 2D, the base unit 100 comprises a base 110, contact pins 150, 160, and an elastomer 190. There are recessed regions in the base 110 to support the elastomer 190 and the contact pins 150, 160. The elastomer 190 is located on the upper portion of the base 110 with a good compressibility and elasticity. Due to the elastic effect of the elastomer 190, the IC chip under test and the interposer 200 will be closely connected to the base unit 100 after the whole modularized socket is assembled, therefore enhancing the electrical connections between different elements.

The contact pins 150, 160 are located within the base unit 100 with symmetry position. It is easy to see in FIG. 2D that the positions of contact pins 150 and 160 inside the base 110 are slightly different and interlaced in order to increase the pin assignment of the device and for the purpose of convenience.

Figure 3:
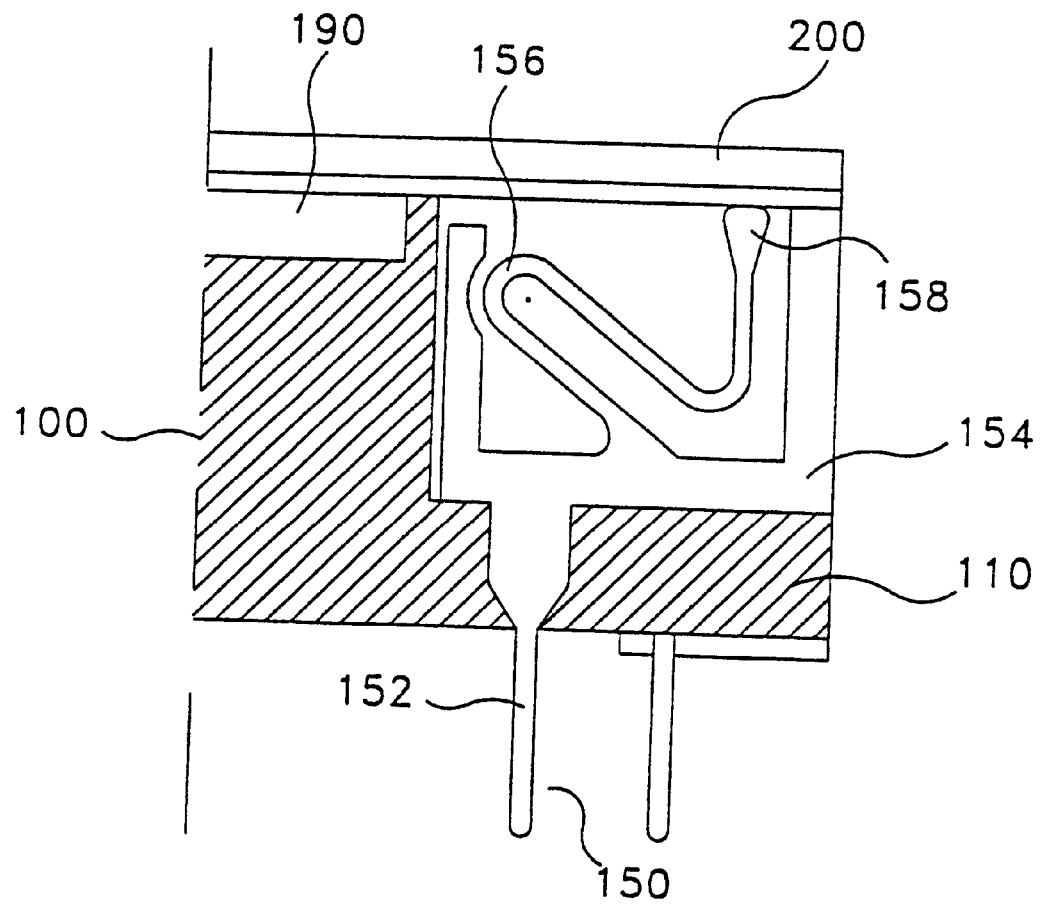
FIG. 3 is an enlarged view of a base unit according to the first embodiment of the present invention.

Referring to FIG. 3 now, the figure shows the enlarged sectional base unit 100 in FIG. 2D, wherein the interposer 200 is rigidly close to the base 110 and with the elastomer 190 in-between. The fastened contact pin 150 in the base 110 is used to electrically connect the upper interposer 200 and the underneath printed circuit board (not shown in the figure). The soldering end 152 of the contact pin 150 is passing through the holes in the printed circuit board and welding on it. There are areas at the contact pin 150 and above the soldering end 152 that will equipped with several protrusions to fasten the contact pin 150 into the base 110.

The stationary portion 154 of the contact pin 150 is located in the recession of the base 110 as shown in the figure. The central part of the contact pin 150 is a U shape cantilever 156 and a contact portion 158. The contact pin 150 provides a good flexibility due to the special configuration of the U shape cantilever 156. Therefore, when the interposer 200 and the base unit 100 are assembled together, the contact portion 158 of the contact pin 150 is connected to the interposer 200 and keeps a good electrical connection because of the U shape cantilever 156.

Figure 4:
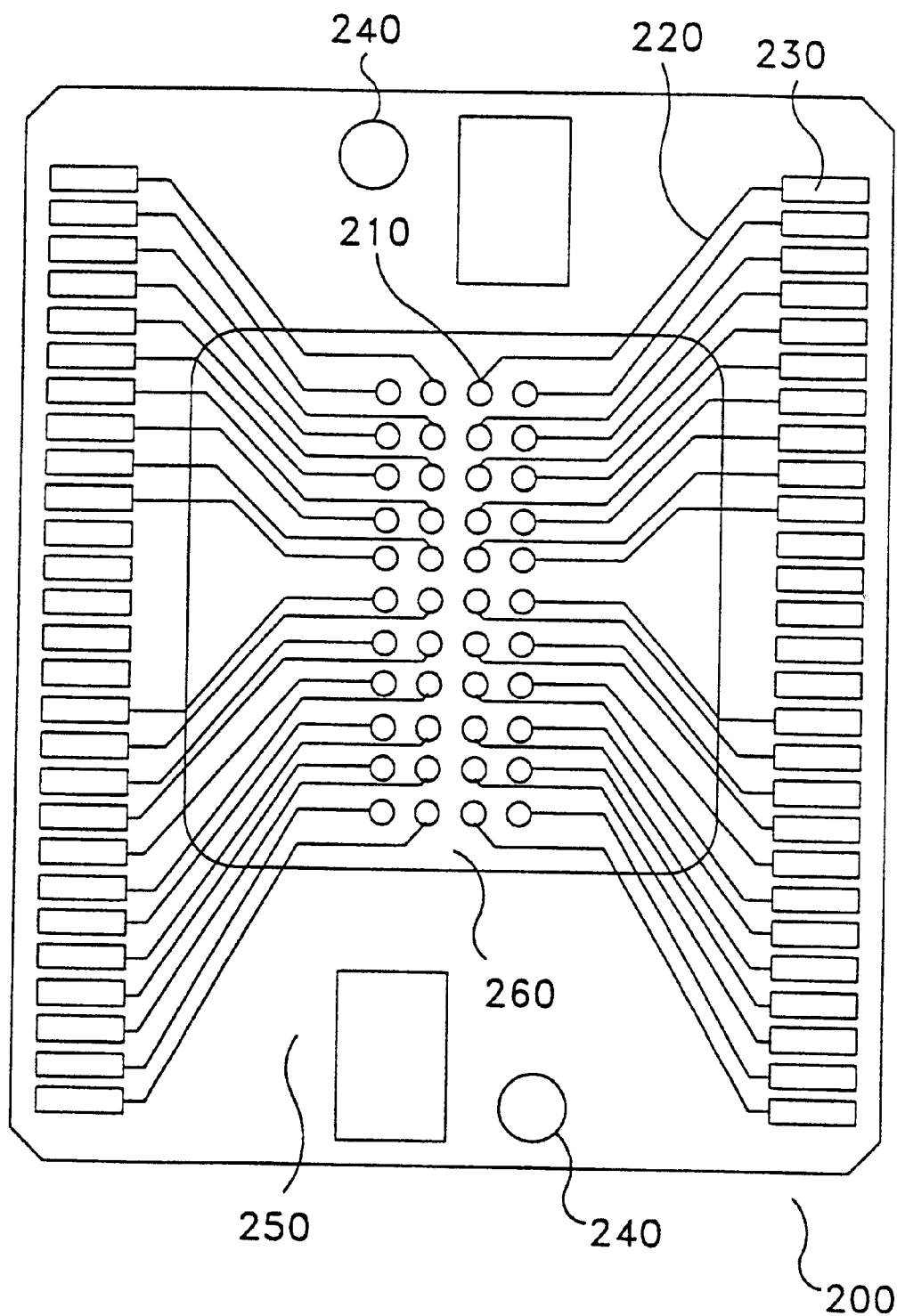
FIG. 4 is a front view of an interposer according to the first embodiment of the present invention.

(2) The interposer 200: Referring to FIG. 4, the figure is a front view of the interposer 200. The interposer 200 comprises acceptors 210, conducting wires 220, contact pads 230, a flexible film 260, a stiffener 250, and positioning holes 240. The two positioning holes 240 are used to match up with the base unit 100 in order to assemble the modularized IC socket correctly. In operation, the acceptors 210 are contact with solder balls of the IC chip. Electrical signals are carrying from the IC chip to the acceptor 210, and then pass through the coupling conducting wire 220 to the contact pad 230, finally come over the contact portion of the contact pin to the circuits of the PCB.

Referring now to FIG. 5A and 5B, the two figures show the cross-sectional view of the interposer 200. The interposer 200 is composed of a flexible film 260 with a lower dielectric constant, a higher glass transition temperature $T_g$, and an excellent mechanical characteristics to fit the high temperature and high frequency testing. A stiffener 250 is used to support the flexible film 260 and is made of a high temperature enduring material.

The acceptors 210 of the flexible film 260 are used to locate the solder balls 510 of the IC chip 500 as shown in FIG. 5B. The IC chip 500 can roughly put over the acceptors 210 of the flexible film 260 and guided by a recession of the acceptor 210 to a precise location.

Back to FIG. 5A again, the acceptors 210 are located in the flexible film 260 with one end on the upper surface of the flexible film 260 and contact with the solder ball 510, the other end on the lower surface of the flexible film 260 and connected to the contact pads 230 via conducting wires 220, the contact pads 230 are next electrically connected to the contact portions 158 of the pins 150 as shown in the figure. The contact pad 230 is made of copper material and is coated with an anti-oxidation conducting layer to avoid oxidation of the pad during testing.

(3) The adapter unit 300: Return to FIGS. 2A to 2D, the element between the interposer 200 and the cover unit 400 is an adapter unit 300. The adapter unit 300 comprises an adapter base 330 (as shown in FIG. 2C), a depressor 310, and a shaft 320 (as shown in FIG. 2B). The adapter base 330 has inclined surfaces to position the IC chip 500 and direct the IC chip 500 locate on a testing area easily and then electrically contact with the interposer 200.

The depressor 310 in FIG. 2B is supported by a shaft 320 and is pivoted on the shaft. One end of the depressor 310 is coupling to the cover unit 400 and will suppress or release the IC chip 500 in another end due to the action of the cover unit 400. In this figure, the cover unit 400 is located in a lower position with solid line and a cooperated depressor 310 also with solid line, and an upper position with dotted line with a cooperated depressor 310. When the cover unit 400 presses downward, the coupling depressor 310 will rotate to release and free the IC chip 500. Nevertheless, when the cover unit 400 moves upward, the coupling depressor 310 will rotate reversely and suppress on the IC chip 500.

(4) The cover unit 400: The cover unit 400 comprises a cover and springs. As described above, the cover unit 400 can move up and down vertically and drive the coupling depressor 310 to press or release the IC chip 500. Further referring to FIG. 2C, an upper and a lower position of the cover unit are also shown in this figure. The springs 410 inside the four corners of the cover unit 400 are used to provide the flexibility and force to move the cover unit 400 up and down. As can be seen in FIG. 2A, since the IC chip 500 is disposed in the opening of the cover unit 400, the operation of the cover unit 400 to press downward and release IC chip or pull upward and suppress IC chip will result in the IC chip 500 more easy to install and also obtain a better protection when testing.

The modularized IC socket of the first preferred embodiment of the present invention is more suitable for an array type IC chip package. It is well understood in terms of the above descriptions that when the pin assignment of the IC chip 500 are changed, the interposer 200 can be redesigned to fit the different IC chip again. Even though the size of the IC chip is changed, it is also possible to only change the adaptor unit 300 and the cover unit 400 but keep the base unit 100 that is welding on the printed circuit board unchanged. Furthermore, if only one of the IC socket on the board is damaged, it is easy to replace the damaged module of the socket and don't have to repair the socket.

The Second Preferred Embodiment

Figure 6A:
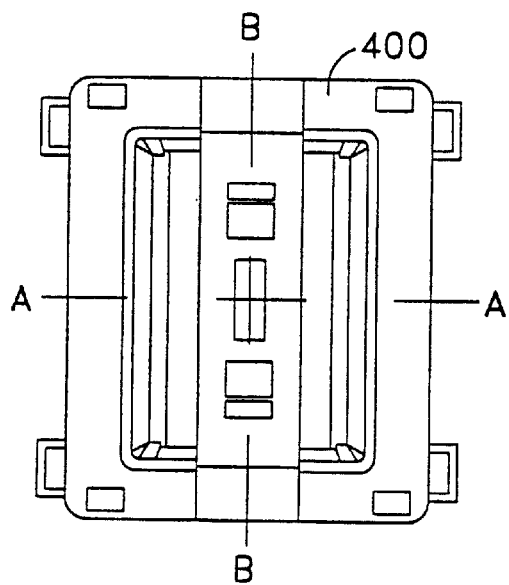
FIGS. 6A~6C are three views of a modularized IC socket according to the second embodiment of the present invention.
Figure 6B:
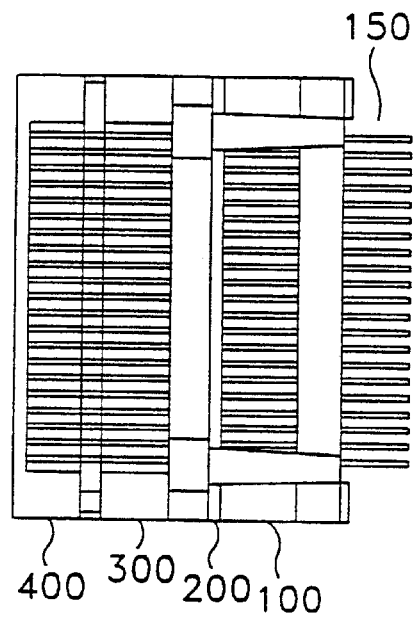
Figure 6C:
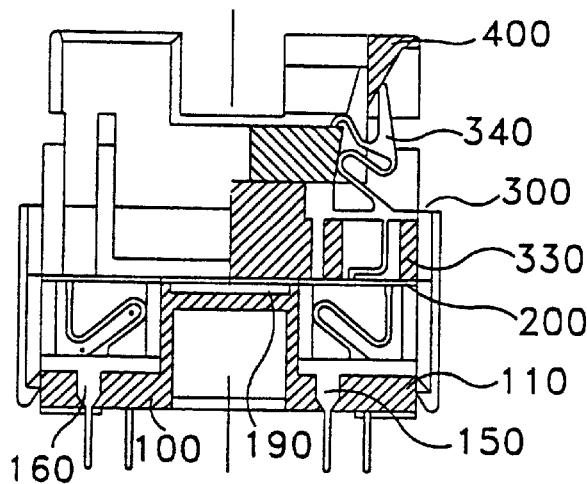

Referring to FIGS. 6A to 6C, these figures show the three views of the modularized IC socket according to the second embodiment of the present invention. The cross-sectional view along the line is shown in FIG. 6A, another cross-sectional view along the line BB is shown in FIG. 6B. The detail description of the second embodiment is as follows:

(1) The base unit 100: Referring now to FIG. 6C, the base unit 100 comprises a base 110, and contact pins 150, 160. The configurations and functions of the base unit 100 of the second embodiment are almost the same as the first embodiment except the element of elastomer. That is, the contact pins 150,160 inside the base 110 are electrically connected to the upper interposer 200 and the lower printed circuit board (not shown in the figure) as the base unit of the first embodiment.

Figure 7:
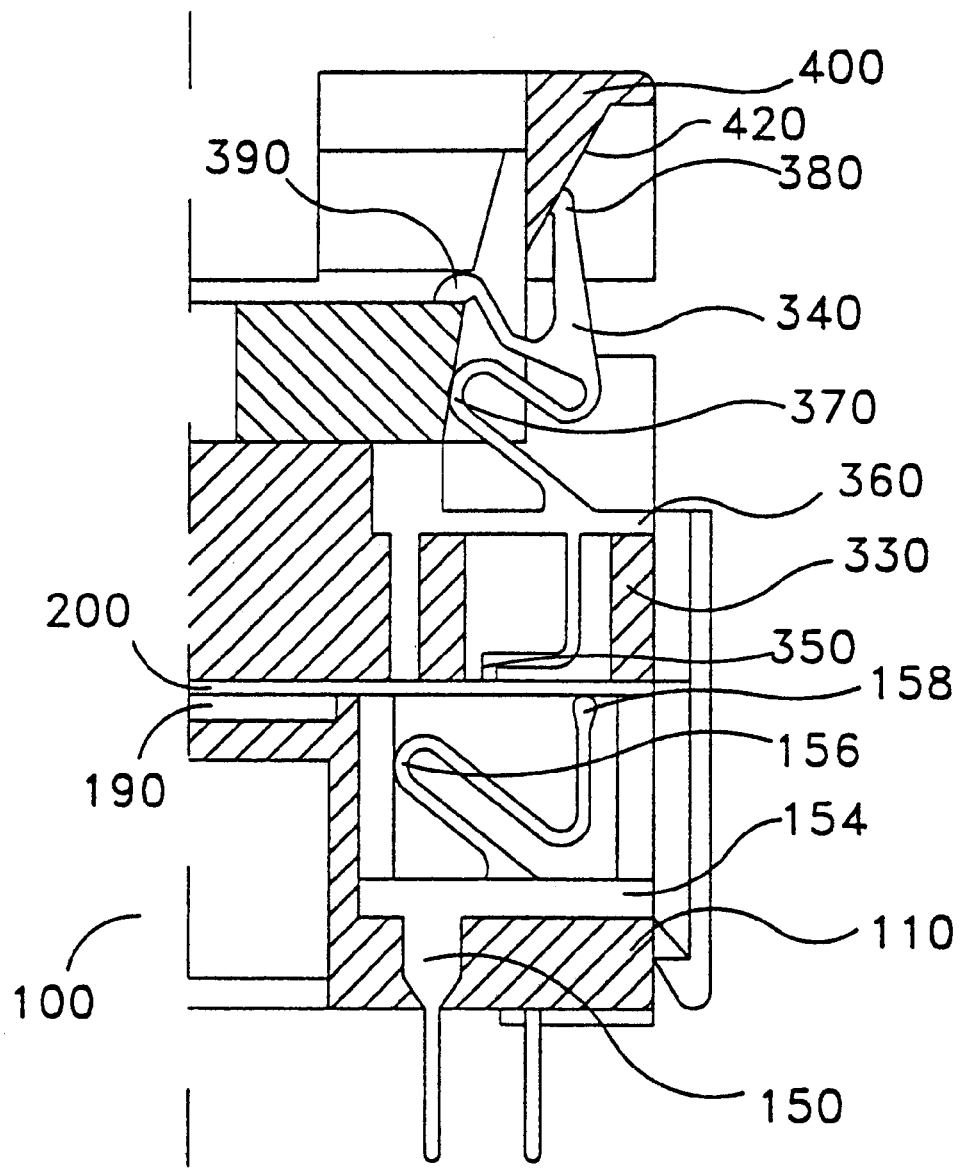
FIG. 7 is an enlarged cross-section view of a contact pin according to the second embodiment of the present invention.

Referring to FIG. 7, the figure is part of an enlarged cross-sectional view according to FIG. 6C. The stationary part 154 of the contact pin 150 in the base unit 100 is installed inside the recessed portion of the base 110. It is further comprises an U shape cantilever 156 and a contact portion 158 of the contact pin 150 to maintain the good electrical contact between the base unit 100 and the interposer 200.

Figure 8A:
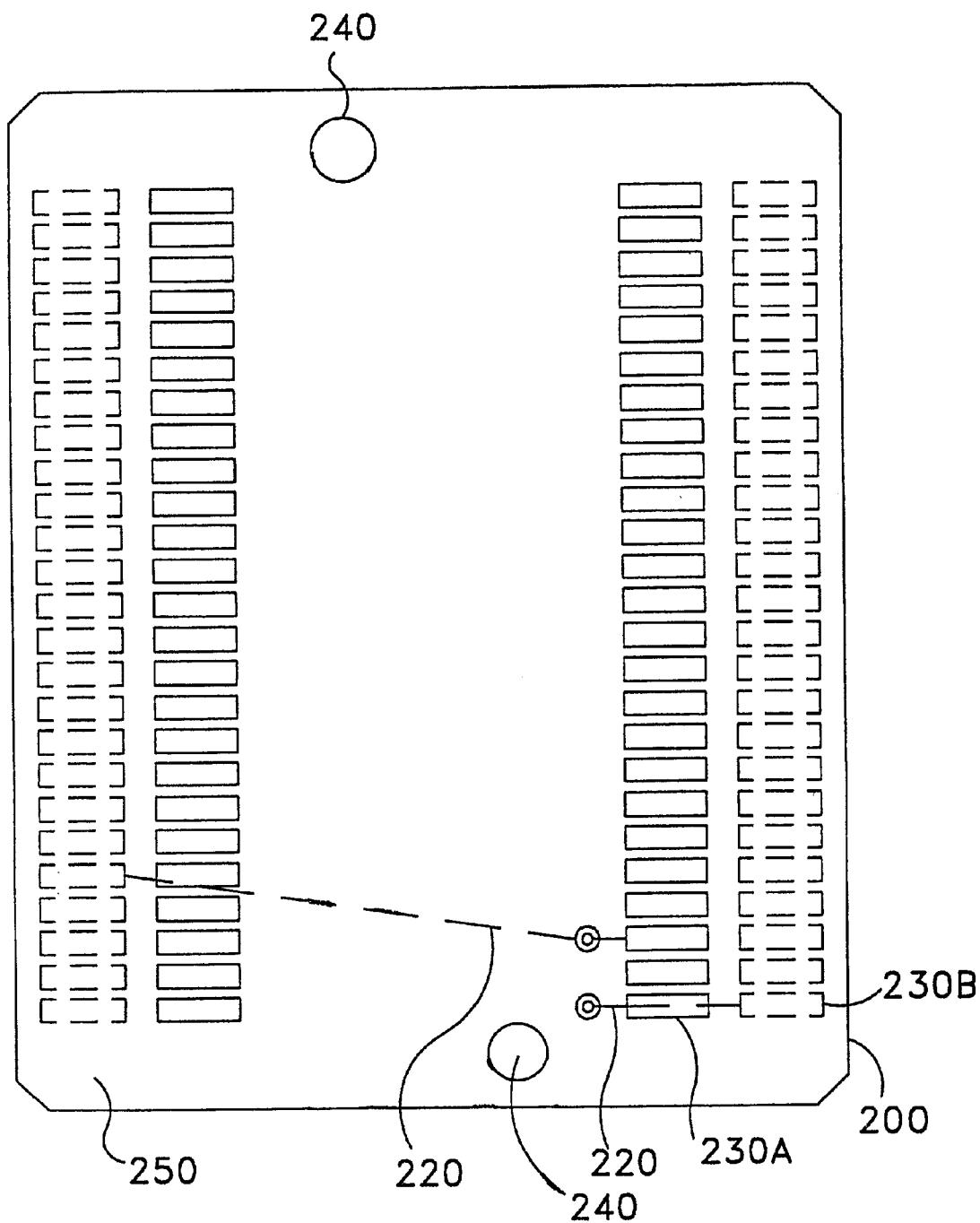
FIGS. 8A and 8B are a vertical view and a lateral view of an interposer according to the second embodiment of the present invention.
Figure 8B:
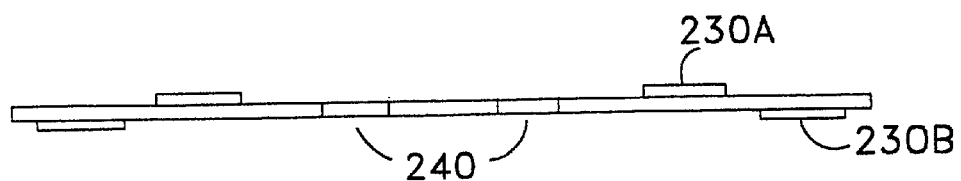

(2) The interposer 200: Referring to FIGS. 8A and 8B, these figures show the vertical view and lateral view of the interposer 200. The interposer 200 comprises a stiffener 250, contact pads 230A, 230B, and conducting wires 220. There are two positioning holes 240 located at the two ends of the interposer 200 separately to match up with the base unit 100. The interposer 200 is an electrical interface between the upper adapter unit 300 and the lower base unit 100 to transmit the electrical signal to the printed circuit board. One end of the contact pin 340 in the adapter unit 300 is electrically connected to the contact pads 230A, and through the joined conducting wires 220 with the contact pads 230A to another contact pads 230B. (The detail of the adapter unit will be described later.) Then, the signal will transmit to the PCB through the contact pin 150 inside the base unit 100.

Furthermore, the interposer 200 is made of a high temperature enduring material. The bolts on the base unit 100 can pass through the corresponding positioning holes 240 of the interposer 200 to assemble the base unit 100, the interposer 200, and the adapter unit 300 correctly. The contact pads 230A, 230B are made of copper and coated with an anti-oxidation conducting layer to avoid pad oxidation and effect the transmission of signals.

(3) The adapter unit 300: Return to FIG. 7, the adapter unit 300 is located between the cover unit 400 and the interposer 200. It further comprises an adapter base 330 and contact pins 340 in this adapter unit. The adapter base 330 is provided to position the IC chip correctly. The contact pins 340 are installed in the adapter base 330 and are electrically contact with IC chip in one end and electrically contact with the interposer 200 in another.

The stationary portion 360 of the contact pin 340 is fixed in the recessed portion of the adapter base 330. The contact portion 350 at the bottom of the contact pin 340 is electrically connected with the contact pads 230A. (Not shown in this figure) The U shape cantilever 370 above the stationary portion 360 provides a suitable flexibility. The flexibility of the cantilever 370 will cause the contact portion 390 touches the lead finger of the IC chip rigidly or leave the IC chip separately. The movement of the contact pin 340 depends on the engaging portion 380 that is coupling to the inclined plane 420 of the cover unit 400, the up and down movement of the cover unit 400 will remove the contact portion 390 of the contact pin 340 from the IC chip or suppress on the IC chip.

(4) The cover unit 400: The unit comprises a cover and springs, the flexibility of the springs will enforce the cover unit 400 to move upward and then be forced to press downward. As described in the previous section, the cover unit 400 further includes an inclined plane 420 to touch with the engaging portion 380 of the contact pin 340. When the cover unit 400 moves upward, the contact pin 340 will return to the normal position due to the flexibility of the U shape cantilever 370 and then rigidly suppress on the IC chip. Nevertheless, the inclined plane 420 will force on the engaging portion 380 and cause the contact pin 340 to separate from the IC chip when the cover unit 400 presses downward.

The modularized IC socket of the second embodiment of the present invention is more suitable to a lead frame type IC chip package. It is also easy to realize that due to the replaceable parts of the socket, different sizes or pin assignment of the IC chip can be used to test by changing only part of the socket modules.

The lifetime of the IC device is becoming shorter and shorter due to the fast developing of the semiconductor industry. A new developed IC device can be tested by using the modularized and replaceable IC socket of the present invention to reduce the cost.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A modularized socket for an integrated circuit, said socket comprising:

a base unit, said base unit including a base, an elastomer and a contact pin, said elastomer being located at the upper portion of said base, wherein a straight end of said contact pin is fastened inside a recessed portion of said base, wherein a straight end of said contact pin is stretched out of a lower portion of said base to solder on a printed circuit board, another end of said contact pin is stretched out of an upper portion of said base in order to contact with a subsequent element;

an interposer including a first contact pad, a second contact pad, a conducting wire, a flexible film and a stiffener that is placed on said base unit, said stiffener being used to support said flexible film and being disposed peripheral to said flexible film, said first contact pad being located on an upper surface of said flexible film and passing through said flexible film, said second contact pad being located on a lower surface of said flexible film, wherein said first contact pad is connected to said second contact pad via said conducting wire, said first contact pad being electrically connected to an integrated circuit device and said second contact pad being electrically connected to said contact pin of said base unit, said interposer having fixed positioning holes to align with said base unit, an adapter unit including an adapter base and a depressor, said adapter unit being placed on said base unit and said interposer, wherein said adapter base has inclined surfaces to provide positioning function of said integrated circuit device, said adapter unit being combined with said base unit with a plurality of clasps for fastening said adapter unit to said base unit;

a cover unit including a cover and a spring, said cover unit being located over said base unit, said interposer, and said adapter unit, said cover unit being coupled to one end of said depressor and being capable of moving up and down vertically by said spring, wherein when said cover moves upward, said depressor will move downward and press said integrated circuit device, nevertheless, when said cover moves downward, said depressor will move upward and release said integrated circuit device.

2. The socket of claim 1, wherein said elastomer of said base unit has elasticity and compressibility to provide a good contact and electrical connection.

3. The socket of claim 1, wherein said contact pin of said base unit has a U shape cantilever to provide flexibility of said contact pin.

4. The socket of claim 1, wherein said first contact pad of said interposer is a recessed portion to conduct a solder ball of said integrated circuit device.

5. The socket of claim 4, wherein said first contact pad of said interposer is electrically connected with said solder ball of said integrated circuit device directly.

6. The socket of claim 1, wherein said depressor is rotated through a shaft to suppress on said integrated circuit device and is electrically connected with said first contact pad.

7. The socket of claim 1, wherein said first contact pad of said interposer is electrically connected with said solder ball of said lead finger of said integrated circuit device indirectly.

8. The socket of claim 1, wherein said first and second contact pad of said interposer are coated with an anti-oxidation conducting layer.

* * * * *